US009279865B2

(12) United States Patent
Liu et al.

(10) Patent No.: US 9,279,865 B2
(45) Date of Patent: Mar. 8, 2016

(54) METHOD AND STRUCTURE FOR TESTING AND CALIBRATING THREE AXIS MAGNETIC FIELD SENSING DEVICES

(75) Inventors: Lianjun Liu, Chandler, AZ (US); Phillip Mather, Phoenix, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 760 days.

(21) Appl. No.: 13/467,175

(22) Filed: May 9, 2012

(65) Prior Publication Data

US 2013/0300402 A1    Nov. 14, 2013

(51) Int. Cl.
 *G01R 35/00* (2006.01)
 *G01R 33/09* (2006.01)
 *G01R 33/00* (2006.01)
 *G01R 33/02* (2006.01)

(52) U.S. Cl.
 CPC ............ *G01R 33/09* (2013.01); *G01R 33/0035* (2013.01); *G01R 33/0206* (2013.01); *G01R 33/093* (2013.01); *G01R 35/00* (2013.01); *G01R 35/005* (2013.01)

(58) Field of Classification Search
 CPC .......... G01R 33/00–33/64; G01R 35/00–35/06
 USPC ........................................................ 324/202
 See application file for complete search history.

(56) References Cited

U.S. PATENT DOCUMENTS

| 5,952,825 | A | 9/1999 | Wan |
| 6,707,298 | B2 | 3/2004 | Suzuki et al. |
| 7,154,267 | B2 | 12/2006 | Withanawasam |
| 7,323,870 | B2 * | 1/2008 | Tatschl et al. ................. 324/252 |
| 9,069,033 | B2 * | 6/2015 | Chen .................... G01R 33/098 |
| 2003/0057938 | A1 * | 3/2003 | Goetz .................. G01R 33/096 324/117 R |
| 2011/0074406 | A1 * | 3/2011 | Mather et al. ................. 324/252 |
| 2011/0169488 | A1 * | 7/2011 | Mather ......................... 324/252 |
| 2011/0244599 | A1 | 10/2011 | Whig et al. |
| 2012/0062215 | A1 | 3/2012 | Ide et al. |
| 2012/0062224 | A1 * | 3/2012 | Ide et al. ....................... 324/252 |

OTHER PUBLICATIONS

International Searching Authority, International Search Report and Written Opinion for International Application No. PCT/US13/39463, mailed Oct. 25, 2013.

\* cited by examiner

*Primary Examiner* — Tung X Nguyen
*Assistant Examiner* — Adam Clarke
(74) *Attorney, Agent, or Firm* — Bookoff McAndrews, PLLC

(57) ABSTRACT

A structure and method are provided for self-test of a Z axis sensor. Two self-test current lines are symmetrically positioned adjacent, but equidistant from, each sense element. The vertical component of the magnetic field created from a current in the self-test lines is additive in a flux guide positioned adjacent, and orthogonal to, the sense element; however, the components of the magnetic fields in the plane of the sense element created by each of the two self-test current line pairs cancel one another at the sense element center, resulting in only the Z axis magnetic field being sensed during the self-test.

13 Claims, 3 Drawing Sheets

METHOD AND STRUCTURE FOR TESTING AND CALIBRATING THREE AXIS MAGNETIC FIELD SENSING DEVICES

TECHNICAL FIELD

The present invention generally relates to a magnetic field sensing device for sensing magnetic fields in three orthogonal directions and more particularly to a magnetoelectronic three axis field sensor providing on-chip testing and calibration.

BACKGROUND

Sensors are widely used in modern systems to measure or detect physical parameters, such as direction, position, motion, force, acceleration, temperature, and pressure. While a variety of different sensor types exist for measuring these and other parameters, they all suffer from various limitations. For example, inexpensive low field sensors, such as those used in an electronic compass and other similar magnetic sensing applications, may comprise anisotropic magnetoresistance (AMR) based devices. In order to arrive at the required sensitivity and reasonable resistances that mesh well with complementary metal-oxide semiconductors (CMOS), the chip area of such sensors are generally in the order of square millimeters in size. Furthermore, large set-reset pulses from bulky coils of approximately 500 mA are typically required. For mobile applications, such AMR sensor configurations are costly, in terms of expense, circuit area, and power consumption.

Other types of sensors, such as magnetic tunnel junction (MTJ) sensors, giant magnetoresistance (GMR) sensors, and the widely used Hall effect sensors have been used to provide smaller profile sensors, but such sensors have their own concerns, such as inadequate sensitivity and the temperature dependence of their magnetic field response. To address these concerns, MTJ, GMR, and AMR sensors have been employed in a Wheatstone bridge structure to increase sensitivity and to reduce the temperature dependent resistance changes. Hall effect sensors have recently become competitive in this type of application through the development of high sensitivity silicon (Si) based sensors coupled with a thick nickel iron (NiFe) magneto-concentrator for amplification of the local magnetic field. These Hall effect devices typically employ the current spinning technique for optimal temperature response, resulting in a larger than desired CMOS footprint for the circuitry associated with the multiplexing between the various tap point functionality. For minimal sensor size, cost and high performance, MTJ sense elements are preferred.

As a result of the manufacturing process variations, low field Wheatstone bridge based magnetic sensors may exhibit a small yet variable residual offset. Temperature shifts, mechanical stress, and the aging of the device may cause small changes in this offset. Furthermore, conventional magnetic sensors have a sensitivity built into the device by factors such as sense layer thickness, shape, and flux concentrator geometry. Therefore, small variations in the manufacturing process may create variations in the sensor parameters and therefore create a need for the magnetic sensors be tested and calibrated for optimal performance.

As magnetic sensor size becomes smaller, the packaging and test costs begin to dominate the final product cost. For a magnetic field sensing solution that minimizes manufacturing costs, increasingly attention must be paid to minimization of test time and complexity. As packaging and final test are increasingly performed by contractors at remote locations with massively parallel testing systems, the large development and installation cost of specialized test apparatus to apply an external magnetic field for testing of sensor characteristics becomes prohibitive. An additional problem is that the magnetic environment may not be completely controlled on the production floor.

Accordingly, it is desirable to provide an inexpensive low field three axis sensor and method that provides on chip testing and calibration. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A magnetic field sensor and method are provided for on chip testing and calibration.

A first exemplary magnetic field sensor comprises a first magnetoresistive sense element formed over a substrate, the first magnetoresistive sense element defining a first long axis; and a first plane through the first long axis, the first plane being perpendicular to the surface; first and second self-test current carrying lines equidistant from, parallel to, and on opposed sides of, the first plane; and a first flux guide adjacent a first edge of the first magnetoresistive sense element, wherein a first component of a first magnetic field in a second plane parallel to the surface and created by a first current in a first direction in the first self-test current carrying line, and a second component of a second magnetic field in the second plane and created by a second current in a second direction in the second self-test current carrying line cancel one another at the intersection of the first plane and the first long axis of the first magnetoresistive sense element, and the first and second magnetic field components parallel to the first plane are additive at the first flux guide and a portion of the out of plane components are guided into the first magnetoresistive sense element as a third component.

A second exemplary magnetic field sensor comprises a first plurality of groups of first magnetoresistive sense elements formed over a substrate, wherein each first magnetoresistive sense element defines a first long axis and a first plane through the first long axis and perpendicular to the surface; a first plurality of first pairs of self-test current carrying lines, each first pair comprising first and second current carrying lines, one each of the first and second current carrying lines equidistant from, parallel to, and on opposed sides, of one of the first planes; and a first plurality of flux guides, one each adjacent a first edge of one each of the first magnetoresistive sense elements, wherein a first component of a first magnetic field parallel to the surface and created by a first current in a first direction in the first self-test current carrying line and a second component of a second magnetic field parallel to the surface and created by a second current in a second direction in the second self-test current carrying line are canceled at each respective first magnetoresistive sense element, and third components parallel to the first plane are additive at the flux guides and are guided into the first magnetoresistive sense elements.

An exemplary method for testing a plurality of groups of magnetic field sensors formed over a substrate, wherein each magnetoresistive sense element defines a long axis and a plane through the long axis, and having one of a plurality of flux guides positioned adjacent one of the magnetic field sensors, comprising applying a first current in the first self-test current line to create a first component of a first magnetic field in the plane of the magnetic field sensors; and applying a second current in the second self-test current line to create a second component of a second magnetic field in the plane of the magnetic field sensors, wherein the first and second components are canceled at the magnetoresistive sense element, and additional components of the first and second magnetic field out of plane are additive at the flux guide and guided into the magnetoresistive sense element.

BRIEF DESCRIPTION OF THE DRAWINGS

The present invention will hereinafter be described in conjunction with the following drawing figures, wherein like numerals denote like elements.

DETAILED DESCRIPTION

Figure 1:
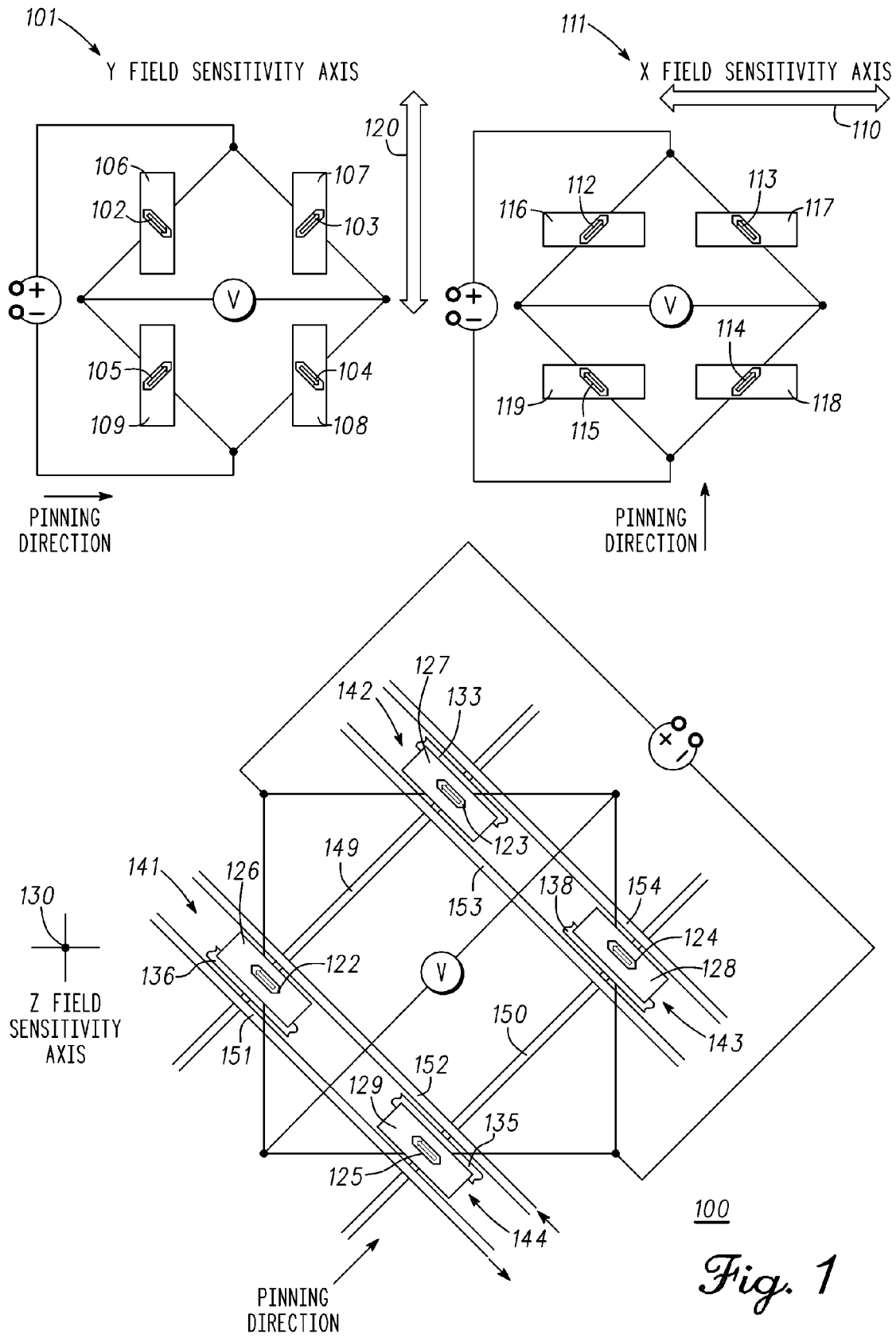
FIG. 1 illustrates an electronic compass structure which uses differential sensors formed from three bridge structures with MTJ sensors in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Through the integration of high aspect ratio vertical bars (flux guides) of a high permeability material, for example, nickel iron (NiFe), whose ends terminate in close proximity to opposed edges and opposite sides of a magnetic sense element, a portion of the Z axis field can be brought into the XY plane. These flux guides serve to capture magnetic flux from an applied field oriented in the Z direction, and in so doing, bend the field lines in a substantially horizontal manner near the ends of the flux guides. Through asymmetric positioning of the flux guides, e.g., the flux guide segment above the left edge of sense elements in two legs of the four legs of a Wheatstone bridge, and the flux guide above the right edge of sense elements in the other two legs, the horizontal components may act in an opposite directions for the two pairs of legs resulting in a strong differential signal. A field applied in the X or Y direction will project equally on all four legs of the bridge and hence be subtracted out and not contribute to the final sensor signal. Separate bridges are included elsewhere on the magnetic sensor chip for determining the X and Y components of the magnetic signal, and in this manner, a field with components in all three spatial orientations can be accurately determined by a single chip magnetoresistive sensing module, for example, based on magnetic tunnel junction (MTJ) sense elements. Finite Element Method (FEM) simulations have shown that a pair of high aspect ratio flux guides, e.g., 25 nm wide by 500 nm high and extending several microns in the third direction, when optimally positioned will provide a signal on an individual element that is about 80% of the of the signal measured from an in plane (x axis) field of the same strength. Additional signal may be obtained through closer proximity of the flux guide to the sensor, increases in the flux guide height, and additional shaping of the guide geometry. One example is to add horizontal segments parallel to the sense element which extend over the edges of the sense element. Other examples are to form a U which is placed with the interior horizontal segment aligned with the outer edge of the sense element, angled termination of the vertical segments to extend the flux guide partially in the plane of the sense element, and a similarly placed box structure. These geometries serve to further enhance the horizontal component of the guided flux and move it to a more central region of the sensor. A structure with individual 25 nm wide vertical bars utilized as flux guides is tolerant to overlay errors and produces an apparent x to z field conversion (for a differentially wired Wheatstone bridge) at the rate of 2.5% for a misalignment of 85 nm (3 sigma) between a single flux guiding layer and the sense layer.

The flux guiding layer may be formed from layers typically used in the magnetic random access memory (MRAM) process flow, during which bit and digit lines cladded with a high permeability magnetic material (such as in typical magnetic memory devices), referred to herein as a flux guide, are used to increase the field factors present to reduce the current needed to switch the memory storage element. In the sensor application, the same process flow may be used with the optional additional step of sputtering out the bottom of the digit line in order to remove any cladding present on the trench's bottom. Modifications may be made to the process flow so that the height and width of the cladding used for flux guiding are at optimum values instead of the 500 nm and 25 nm, respectively that are used in the exemplary process described above.

Small footprint magnetic sensors typically are laid out in a Wheatstone bridge configuration, where a precise balance between the resistances of the circuit elements must be maintained for the bridge to produce a minimal response in a zero magnetic field. Any nonzero response (bridge offset) present from the manufacturing process must be calibrated or nulled out to produce signals that are free from error. In many applications, a self test function in which a known magnetic field at the sense element locations can be generated by applying a known electrical current on chip, is desired. The self-test function can be useful in determining that the sense elements are working properly, or to measure and calibrate the sensor's sensitivity and temperature characteristics, for example. In a prior patent application Ser. No. 12/684,692 assigned to the assignee of this invention, a structure and method for X and Y sensor self-test has been disclosed. However, while the structure disclosed in the above mentioned disclosure works well for in-plane (X or Y axis) sensors, it isn't as clean for an out of plane (Z axis) sensor. This is mainly because the structure disclosed in the above mentioned patent application Ser. No. 12/684,692 can generate an in-plane X or Y field, but not a purely Z field. The exemplary embodiment described herein include a structure and method to generate a Z axis field at the sense elements and flux guide, wherein the X and Y in plane components are cancelled at the sense element. This is accomplished as described herein by the inclusion of two self-test lines routed in an upper metal layer that is also used as the aluminum termination of the copper pads. These two self-test lines are positioned so that when a current is provided in the self-test lines, any in plane field produced from one line is equal and opposite to the in plane field produced by the other line, while the out of plane field produced by one adds in the same direction as the out of plane field produced by the other, thereby creating a field that is only out of plane at the sense element. In this manner, additional functionality is added to the sensor with minimal or no additional manufacturing cost. While line resistances are not crucial for implementation at final test, the ability to offer a self-test mode in a final portable application requires resistances low enough that the supply voltages can source sufficient current to create the self-test field. The additional desire for low power consumption creates a need for the lowest source current possible, as the application specific integrated circuit (ASIC) supplying the current will need to draw from the supply voltage (Vdd). The current paths that the self-test routing takes can be wired with various widths and various segments connected together in series or parallel. This does not change the overall current flowing above each individual sense element, but does impact the total current that must be sourced. As a low supply current to the self-test line is targeted, care should be taken to create the largest number of lines wired in series for which the source voltage will provide sufficient self-test field.

FIG. 1 shows a magnetic field sensor 100 formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 1 is situated. Exemplary embodiments of the first and second sensors 101, 111 are described in detail in U.S. patent application Ser. No. 12/433,679. As depicted herein, each sensor 101, 111, 121 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the x-axis direction. In similar fashion, the second sensor 111 is formed from the connection of a plurality of sense elements 112-115 in a bridge configuration over a corresponding plurality of pinned layers 116-119 that are each magnetized in the y-axis direction that is perpendicular to the magnetization direction of the pinned layers 106-109. Furthermore, the third sensor 121 in the same plane as the first and second sensors 101, 111 is formed from the connection of a plurality of sense elements 122-125 in a bridge configuration over a corresponding plurality of pinned layers 126-129 that are each magnetized in an arbitrary in plane direction that may be at any angle to the magnetization directions of the pinned layers 106-109 and 116-119. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the third bridge configuration 121, the sense elements 122, 123,124, and 125 all have an easy axis magnetization direction that is orthogonal to the pinned magnetization direction of the pinned layers 126, 127, 128, and 129. The third bridge configuration 121 further includes flux guides 133, 135 positioned adjacent to the right edge of sense elements 123, 125, and flux guides 136, 138 positioned adjacent to the left edge of sense elements 122, 124, respectively. Flux guides 133, 135, 136, and 138 are positioned below sense elements 122-125. The positioning of these flux guides 133, 135, 136, and 138 is subsequently described in more detail in FIG. 2. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using conventional shape anisotropy techniques to establish the easy magnetic axes of the referenced sense elements to be deflected from each other by 90 degrees for the x and y sensors, and referencing a sense element that responds in an opposite manner to an applied field in the Z direction for the Z sensor. The Z sensor referencing will be described in more detail below. The configuration shown in FIG. 1 is not required to harvest the benefits of the third sensor 121 structure described in more detail in FIG. 2, and is only given as an example.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 133, 135, 136, 138 are positioned in sensor 121 below the opposite edges of the elements 122-125, in an asymmetrical manner between legs 141, 143 and legs 142, 144. As flux guides 136, 138 are placed below the sense elements 122, 124, the magnetic flux from the Z field may be guided into the XY plane along the left side and cause the magnetization of sense elements 122 and 124 to rotate in a first direction towards a higher resistance. Similarly, the magnetic flux from the Z field may be guided by the flux guides 133 and 135 into the XY plane along the right side of the sense element and cause the magnetization of sense elements 123 and 125 to rotate in a second direction, opposite from the first direction towards a lower resistance, as these flux guides are located below the sense elements 123, 125. Thus, the sensor 121 can detect the component directions of an applied field along the third axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. Each of the pinned layers 106-109, 116-119, and 126-129 may be formed with one or more lower ferromagnetic layers, and each of the sense elements 102-105, 112-125, 122-125 may be formed with one or more upper ferromagnetic layers. An insulating tunneling dielectric layer (not shown) may be disposed between the sense elements 102-105, 112-115, 122-125 and the pinned layers 106-109, 116-119, and 126-129. The pinned and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, pinned layers 106-109, 116-119, and 126-129 may be formed with one or more layers of ferromagnetic and antiferromagnetic materials to a combined thickness in the range 10 to 1000 Å, and in selected embodiments in the range 250 to 350 Å. In an exemplary implementation, each of the pinned layers 106-109, 116-119, and 126-129 is formed with a single ferromagnetic layer and an underlying anti-ferromagnetic pinning layer. In another exemplary implementation, each pinned layer 106-109, 116-119, and 126-129 includes a synthetic anti-ferromagnetic stack component, for example, a stack of Cobalt Iron (CF)/Cobalt Iron Boron (CFB), Ruthenium (Ru), and CFB which is 20 to 80 Å thick, and an underlying anti-ferromagnetic pinning layer that is approximately 200 Å thick. The lower anti-ferromagnetic pinning materials may be re-settable materials, such as IrMn, though other materials, such as plantinum manganese (PtMn), can be used which are not readily re-set at reasonable temperatures. As formed, the pinned layers 106-109, 116-119, and 126-129 function as a fixed or pinned magnetic layer when the direction of its magnetization is pinned in one direction that does not change during normal operating conditions. As disclosed herein, the heating qualities of the materials used to pin the pinned layers 106-109, 116-119, and 126-129 can change the fabrication sequence used to form these layers.

One of each of the sense elements 102-105, 112-125, 122-125 and one of each of the pinned layers 106-109, 116-119, 126-129 form a magnetic tunnel junction (MTJ) sensor. For example, for bridge circuit 121, sense element 122 and pinned layer 126 form an MTJ sensor 141. Likewise, sense element 123 and pinned layer 127 form an MTJ sensor 142, sense element 124 and pinned layer 128 form an MTJ sensor 143, and sense element 125 and pinned layer 129 form an MTJ sensor 144.

The pinned layers 106-109, 116-119, and 126-129 may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which at the micron size scale will align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-125, 122-125 may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the sense elements 102-105, 112-125, 122-125 function as a sense layer or free magnetic layer because the direction of their magnetization can be deflected by the presence of an external applied field, such as the Earth's magnetic field. As finally formed, sense elements 102-105, 112-125, 122-125 may be formed with a single ferromagnetic layer having a magnetization direction (indicated with the arrows) that aligns along the long-axis of the patterned shapes.

The pinned layers 106-109, 116-119, 126-129 and sense elements 102-105, 112-125, 122-125 may be formed to have different magnetic properties. For example, the pinned layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-125, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

The pinned layers 106-109, 116-119, 126-129 in the MTJ sensors are formed to have a shape determined magnetization direction in the plane of the pinned layers 106-109, 116-119, 126-129 (identified by the vector arrows for each sensor bridge labeled "Pinning direction" in FIG. 1). As described herein, the magnetization direction for the pinned layers 106-109, 116-119, 126-129 may be obtained using shape anisotropy of the pinned electrodes, in which case the shapes of the pinned layers 106-109, 116-119, 126-129 may each be longer in the pinning direction for a single pinned layer. Alternatively, for a pinned SAF structure, the reference and pinned layers may be shorter along the pinning direction. In particular, the magnetization direction for the pinned layers 106-109, 116-119, 126-129 may be obtained by first heating the shaped pinned layers 106-109, 116-119, 126-129 in the presence of a orienting magnetic field which is oriented non-orthogonally to the axis of longest orientation for the shaped pinned layers 106-109, 116-119, 126-129 such that the applied orienting field includes a field component in the direction of the desired pinning direction for the pinned layers 106-109, 116-119, 126-129. The magnetization directions of the pinned layers are aligned, at least temporarily, in a predetermined direction. However, by appropriately heating the pinned layers during this treatment and removing the orienting field without reducing the heat, the magnetization of the pinned layers relaxes along the desired axis of orientation for the shaped pinned layers 106-109, 116-119, 126-129. Once the magnetization relaxes, the pinned layers can be annealed and/or cooled so that the magnetic field direction of the pinned electrode layers is set in the desired direction for the shaped pinned layers 106-109, 116-119, 126-129.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

Figure 2:
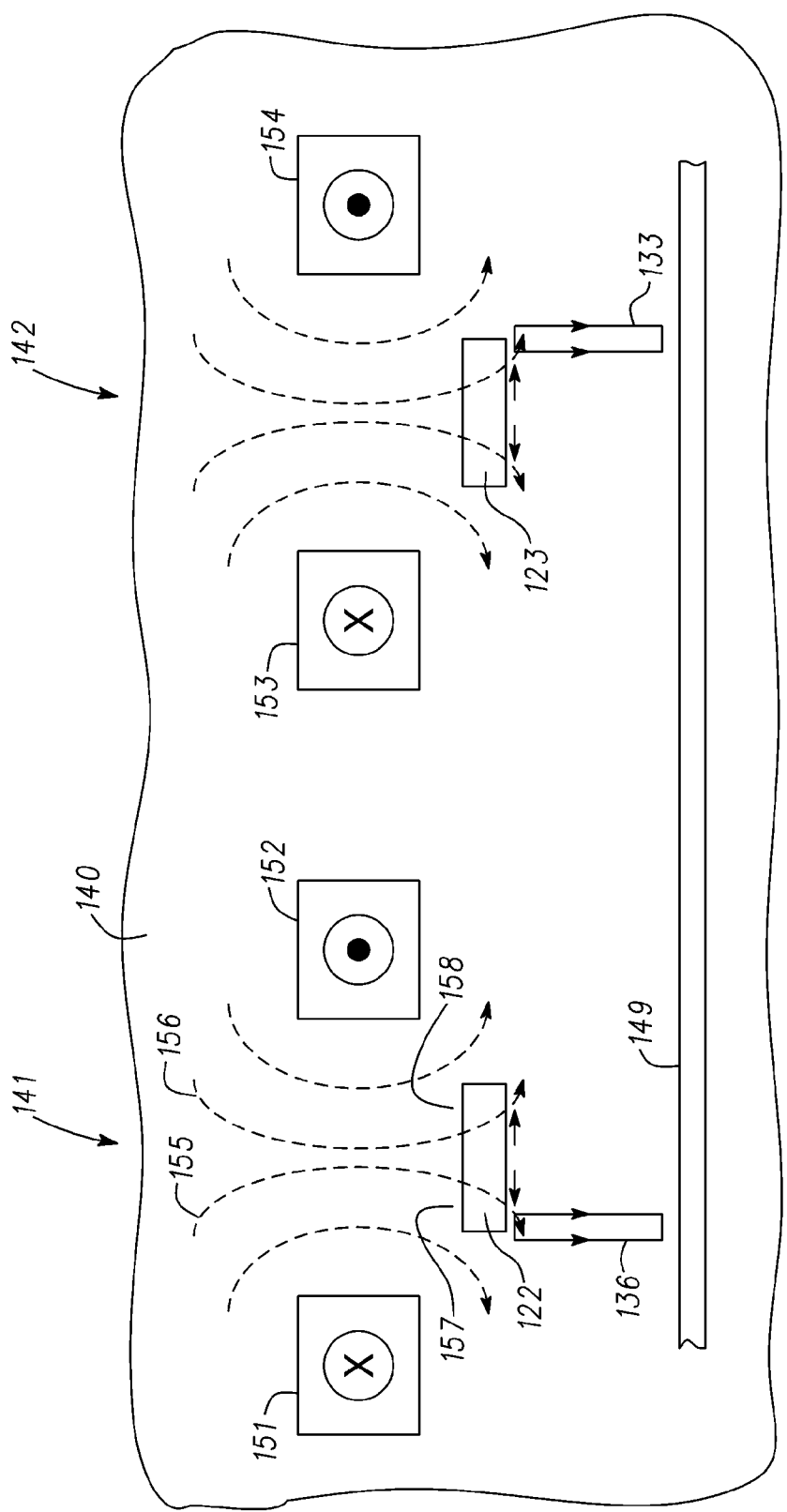
FIG. 2 is a cross section of a magnetic tunnel junction device in accordance with an exemplary embodiment.

It should be noted that all components of this exemplary embodiment as illustrated in FIG. 2 that are similar to components of the exemplary embodiment of FIG. 1 are designated with like numbers.

Referring again to FIG. 1 and in accordance with the exemplary embodiment, self-test lines 151, 152 are formed parallel to the flux guides 135, 136, respectively, equidistant from the sensors 122, 125. Likewise, self-test lines 153, 154 are formed parallel to the flux guides 133, 138, respectively, equidistant from the sensors 123, 124. The self-test lines 151-154 are a conductive material, for example, copper (Cu) or aluminum (Al). For example, a magnetoresistive sense element 122 is formed over a substrate, the magnetoresistive sense element 122 defining a long axis and a first plane through the long axis, the plane being perpendicular to the substrate. First and second self-test current carrying lines 151, 152 are equidistant from, parallel to, and on opposed sides of, the plane; and a flux guide 136 is adjacent a first edge of the first magnetoresistive sense element 122, wherein a first component of a first magnetic field in the plane of the magnetoresistive sense element 122 created by a first current in a first direction in the first self-test current carrying line 151, and a second component of a second magnetic field in the plane of the sense element 122 created by a second current in a second direction in the second self-test current carrying line 152 cancel one another at the intersection of the first plane and the long axis of the magnetoresistive sense element 122, and the first and second magnetic field components out of the plane of the magnetoresistive sense element 122 are additive at the flux guide 136, and a portion of the out of plane components are guided into the magnetoresistive sense element 122 as a third component.

Referring to FIG. 2, a partial cross section of the sense elements 122, 123, flux guides 136, 133 and self-test lines 151, 152 and 153, 154 of adjacent legs 141, 142 are formed in the dielectric material 140 as shown in accordance with the exemplary embodiment.

The flux guide 136 has an end positioned below an edge of the sensor element 122. The flux guide 133 has an end positioned below an edge of the sensor element 123. A metal stabilization line 149 is positioned above and/or below (as shown) the MTJ devices 141-142 for providing a stabilization field on the sensor elements 122, 123. The ends of the flux guides 136, 133 may be brought as close as possible to the sensor elements 122, 123, respectively, with a preferable spacing of less than or equal to 250 nm between the two. The sense elements are brought as close as possible for the tightest density array, preferably less than 2.5 um apart. A metal stabilization line 150 is similarly positioned with respect to MTJ devices 143, 144.

In order to test the sensitivity of the Z axis sensor response utilizing the on chip self-test, a test magnetic field is applied to the flux guides 136, 133 (as well as all other flux guides shown in FIG. 1) by passing a current through the self-test lines, and the differential bridge voltage output is measured. This field is tailored through the placement of the self-test lines 151-154. For example, self-test lines 151, 152 are placed equidistant from the sensor 122. A current introduced to self-test line 151 (into the page as represented by the "X") will create a magnetic field 155, and introduced to self-test line 152 (from the page as represented by the "dot") will create a magnetic field 156. While the self-test lines 151-154 are illustrated as four lines, it is understood they could be one integrated line, or another sub-grouping of series and parallel routed lines for optimal power and voltage requirements as dictated by the device. The vertical (Z) components of the magnetic fields 155, 156 are therefore in the same direction at the location of the flux guide 136 are thus are additive, creating a net vertical (Z) magnetic field. This Z magnetic field flux will act on the flux guide, be brought into the plane of the sense elements, and result in a net change of resistance in the sensor elements 122 and 123. Also, as the pairs of self-test lines 151, 152 are equidistant from the sense elements 122 and 123, the lateral (X or Y) components of the magnetic fields 155 and 156 at the sensor elements 122 and/or 123 are of equal value and with opposite directions, therefore netting zero at the sense element center. At the sense element edges, a slight net in-plane field directing the element in one direction is negated by the same magnitude (but opposite direction) slight net in-plane field acting on the opposite edge. As a result, the resistance change of the sensor elements 122 and 123 are entirely or almost entirely caused by a flux guide (136 or 133) induced redirection of the vertical (Z) component of the magnetic field generated by the self test lines 151-154. In this manner, the signal output from the Z sensor due to a self test current is dependent upon the flux guide geometry and spacing to the sense element; therefore the entire magnetic structure is exercised through the application of the self test and an accurate measurement of the (external field induced) Z sensitivity may be produced.

Figure 3:
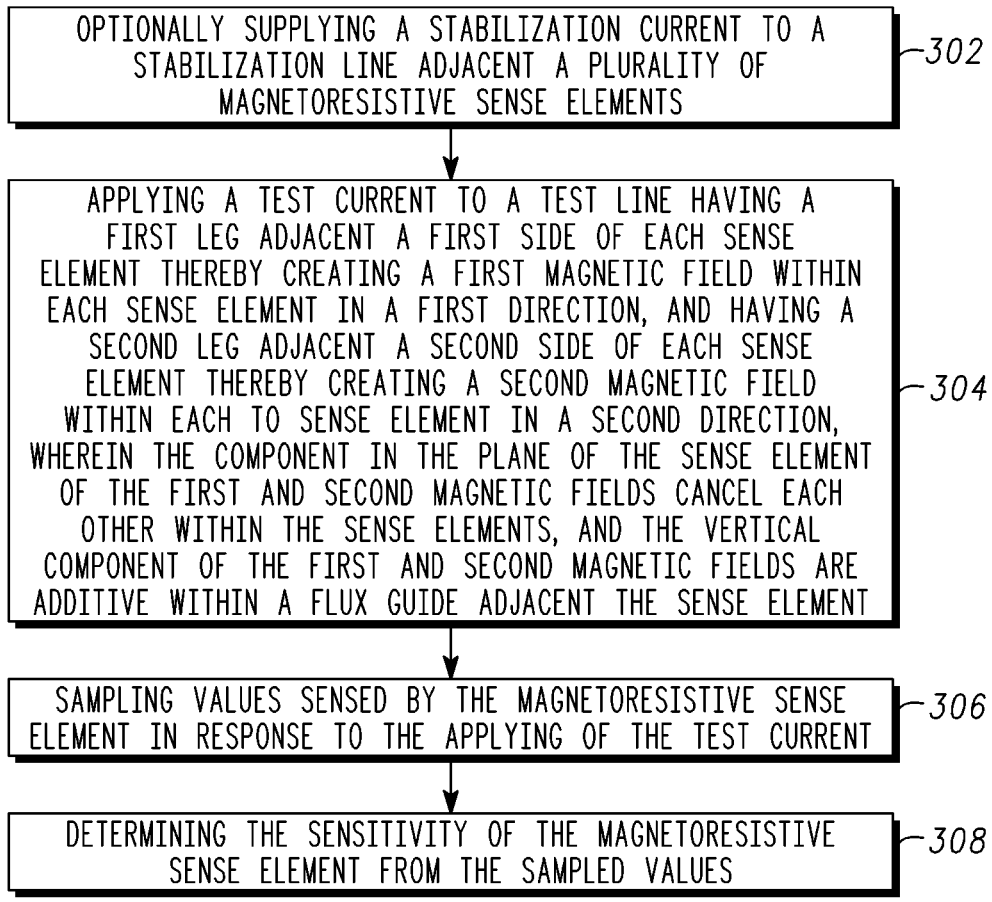
FIG. 3 is a flow chart of an exemplary method for determining sensitivity factors and electrical offset of the magnetic tunnel junction device in accordance with an exemplary embodiment.

FIG. 3 is a flow chart that illustrates an exemplary embodiment of a process 300 for a set of self-test lines to generate magnetic field of predominately vertical (Z) component while minimal horizontal (X or Y) field components. For illustrative purposes, the following description of process 300 may refer to elements mentioned above in connection with FIG. 3. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

Referring to FIG. 3, the method includes optionally supplying 302 a stabilization current to a stabilization line adjacent a plurality of magnetoresistive sense elements, applying 304 a test current to a test line having a first leg adjacent a first side of each sense element thereby creating a first magnetic field within each sense element in a first direction, and having a second leg adjacent a second side of each sense element thereby creating a second magnetic field within each sense element in a second direction, wherein the component in the plane of the sense element of the first and second magnetic fields cancel each other within the sense elements, and the vertical component of the first and second magnetic fields are additive within a flux guide adjacent the sense element, sampling 306 values sensed by the magnetoresistive sense element in response to the test current, and determining 308 the sensitivity of the magnetoresistive sense elements from the sampled values. The sensor bridge output offset can be determined as well using the following procedures.

Algorithms and on chip structures are described below that allow acquisition of sensor performance data through the simple introduction of additional electronic contacts and electrical current paths for generation of a magnetic field at wafer and final test. It is desirable to provide an initial offset trimming that separates any magnetic offset field that may be present from ambient fields in the final test assembly site from the intrinsic sensor electrical offset. These algorithms describe a procedure that separates the effects of an offset field from the electrical imbalance of the sensor legs. Magnetic testing and calibration can take place through purely electrical contacts and in a non-shielded environment as long as the magnetic offset fields are not time varying on a time scale similar to the measurement data rate. Once the electrical offset is known, it can either be trimmed out through blowing on chip magnetic tunnel junction anti-fuses, or a calibration factor can be stored in non-volatile memory to allow correction of the measured sensor values by the sensor ASIC; therefore, a magnetic sensor with as close to the optimal zero offset as possible is produced.

Additionally, during this process the sensitivity factors are measured and can be stored as well. Therefore, a complete sensor calibration may be achieved in the presence of a magnetic field, and utilizing only standard test apparatus present throughout the CMOS industry without any need for magnetic shielding or the application of an external magnetic field. Instead, a localized on chip test field is applied through the introduction of a current through the on-chip current paths. The method to determine the electrical offset may be done at several temperatures to accurately capture any temperature dependent offset drift and introduce compensation factors that then may be applied as the die temperature varies as measured with an on die temperature sensor. Such temperature sensors are a simple ASIC building block. Calibration for this offset temperature dependence also significantly reduces recalibration frequency required of the end user. A sensor self-test mode in a final product may be used to re-characterize sensor performance in a different temperature, stress, magnetic environment as well as calibration for effects due to aging over the life of the part, effectively increasing the sensor stability, accuracy, and extending the sensor life time.

The self-test metal routing alone allows for a calibration of sensitivity and a measure of functionality, but cannot provide one of the most critical sensor parameters, the offset, which can also be due to the an external interfering magnetic field. When one combines measurements at different self-test currents with measurements at different stabilization current values, it becomes possible to extract the intrinsic sensor electrical offset. This is done through solving a simple system of equations:

$$M_{O1}=S_1(H_O)+E_O$$

$$M_{O2}=S_2(H_O)+E_O$$

where $M_{O1}$ is the measured offset at a first stabilization current value, extracted from several measurements of the sensor with different self test currents, $S_1$ is the sensor sensitivity at a first stabilization current,
$H_O$ is the unknown magnetic offset,
$E_O$ is the unknown electrical offset,
$M_{O2}$ is the measured offset at a second stabilization current value, extracted from several measurements of the sensor stabilized with that current value and with different s self-test currents applied, and
$S_2$ is the sensor sensitivity at a second stabilization current.

The sensor offset is measured twice at two different levels of stabilization current, and thereby the sensitivity factors multiplying any interfering field are modulated. The electrical and magnetic offsets may thus be extracted separately, and calibration data may be written for the sensitivity and electrical offset to be used as correction factors for subsequent measurements. This may be done at final test, and testing at different temperatures may be performed to enable a correction for the temperature dependence of the offset drift as well. The final consumer product may trigger a self-test mode as well to check accuracy of the calibration values or if the (previously calibrated) measured offset drift exceeds a threshold, for example due to temperature dependent effects.

Referring again to FIGS. 1-2, after fabrication of the integrated circuit including the Wheatstone bridges 100, current may be supplied to the self-test lines 151-154 to create a magnetic field that is sensed by the sense elements 122-125. Sample magnetic field response at two or more fields generated by two or more stabilization currents through stabilization lines 149, 150 per field are used to determine sensitivity factors and electrical offset. A first stabilization current and a first self-test current are applied to the magnetic field sensing devices 101, 111, 121 with the whole system held at a first temperature, resulting in a first measurement. The stabilization current is changed to a second value while the self test is still held at the first value, for a second measurement. The self-test current is then adjusted to its second value while the stabilization current is adjusted to its first value for a third measurement. Finally, the stabilization current is returned to the second value and the self-test current is maintained at the second value, and a fourth measurement is taken. The sensitivity and sensor offset may then be determined for each of the two stabilization current values:

$$S_1=(M_1-M_3)/(ST_1-ST_2)$$

$$S_2=(M_2-M_4)/(ST_1-ST_2)$$

$$M_{O1}=\frac{1}{2}\{(M_1+M_3)-S_1*(ST_1+ST_2)\}$$

$$M_{O2}=\frac{1}{2}\{(M_2-M_4)-S_2*(ST_1+ST_2)\}$$

where $M_{1-4}$ are the measured values and $ST_1$ and $ST_2$ are the magnetic fields applied by the first and second stabilization currents.

Once $M_{O1}$, $M_{O2}$, $S_1$ and $S_2$ are determined, the formulas given above are applied and the electrical and magnetic components of the sensor offset are determined Additional stabilization and/or self-test currents may be applied to determine sensor linearity and a least squared method of determining the electrical and magnetic offset may be applied for improved accuracy and noise immunity. The procedure may be applied at more than one temperature to determine how the electrical offset changes with temperature to introduce a higher level of calibration into the system. After the calibration factors are determined, any subsequent measurement will subtract the electrical offset, and utilizing the measured slope of the electrical offset with temperature may also subtract a temperature dependent term. An optional sensitivity scaling may be applied as well, based upon the temperature dependent measurements. These corrected measurement values are much more accurate than the original uncorrected values.

The capability to self test magnetic sensors by an integrated magnetic field generating line at probe, final test, and in the consumer product provides the ability to calibrate electrical offset and sensitivity of the individual sensors without application of external magnetic fields, and in the presence of an interfering field. Any change in the sensor characteristics during the life of the part can also be calibrated in the final environment. Reduced packing and test costs provide a more competitive cost of the magnetic sensor.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetic field sensor comprising:
a substrate having a surface;
a first magnetoresistive sensor comprising:
    a first sensing element having a first side lying parallel to the surface of the substrate, and a second side opposed to the first side and having first and second opposed edges; and
    a first flux guide disposed adjacent to the first side of the sensing element and having an end that is proximate to the first edge and the first side of the sensing element,
    wherein the first sensing element defines a first long axis and a first plane through the first long axis, the first plane being perpendicular to the surface;
a second magnetoresistive sensor comprising:
    a second sensing element having a first side parallel to the surface of the substrate, the second sensing element having a second side opposed to the first side and having first and second opposed edges; and
    a second flux guide disposed adjacent to the first side of the second sensing element and having an end that is proximate to the second edge and the first side of the second sensing element,
    wherein the second sensing element defines a second long axis and a second plane through the second long axis, the second plane being perpendicular to the surface;
a third magnetoresistive sensor comprising:
    a third sensing element having a first side lying parallel to the surface of the substrate, the third sensing element having a second side opposed to the first side and having first and second opposed edges; and
    a third flux guide disposed adjacent to the first side of the third sensing element and having an end that is proximate to the second edge and the first side of the third sensing element; and
a fourth magnetoresistive sensor comprising:
    a fourth sensing element having a first side lying parallel to the surface of the substrate, the fourth sensing element having a second side opposed to the first side and having first and second opposed edges; and
    a fourth flux guide disposed adjacent to the first side of the fourth sensing element and having an end that is proximate to the first edge and the first side of the fourth sensing element;
a first pair of self-test current carrying lines, the first pair of self-test current carrying lines including a first and a second self-test current carrying line disposed parallel to the second side of the first sensing element and spaced away from the first and second edges of the first sensing element, the first and second self-test current carrying lines being equidistant from, parallel to, and on opposed sides of the first plane and configured to create a magnetic field that is orthogonal to a sensor plane of the first, second, third, and fourth magnetoresistive sensors, wherein a first component of a first magnetic field in a third plane that is parallel to the surface and created by a first current in a first direction in the first self-test current carrying line, and a second component of a second magnetic field in the third plane and created by a second current in a second direction in the second self-test current carrying line cancel one another at the intersection of the first plane and the first long axis of the sensing element, and components of the first and second magnetic fields that are parallel to the first plane are additive at the first flux guide and a portion of the components of the first and second magnetic fields that are parallel to the first plane are guided into the sensing element as a third component, wherein the first and second self-test current carrying lines are disposed parallel to the second side of the third sensing element and spaced away from the first and second edges of the third sensing element; and
a second pair of self-test current carrying lines disposed parallel to the second side of the second sensing element and spaced away from the first and second edges of the second sensing element, each self-test current carrying line of the second pair being equidistant from, parallel to, and on opposed sides of the second plane and configured to create a magnetic field that is orthogonal to the sensor plane of the first, second, third, and fourth magnetoresistive sensors, wherein the second pair of self-test current carrying lines are disposed parallel to the second side of the fourth sensing element and spaced away from the first and second edges of the fourth sensing element,
wherein the first, second, third, and fourth magnetoresistive sensors are coupled in a Wheatstone bridge configuration, the first and second magnetoresistive sensors are connected in parallel, the first and third magnetoresistive sensors are coupled in series, and the second and fourth magnetoresistive sensors are coupled in series.

2. The magnetic field sensor of claim 1, wherein the third component comprises a magnitude that is proportional to the size and shape of the first flux guide and inversely proportional to the distance between the first flux guide and the first sensing element.

3. The magnetic field sensor of claim 1, wherein the first flux guide comprises a high permeability material.

4. The magnetic field sensor of claim 1, comprising a stabilization line perpendicular to the first pair of self-test current carrying lines and adjacent the first magnetoresistive sensor.

5. A magnetic field sensor comprising:
a substrate having a planar surface; and
a first bridge circuit comprising a first magnetoresistive sensor, a second magnetoresistive sensor, a third magnetoresistive sensor, and a fourth magnetoresistive sensor coupled as a Wheatstone bridge for sensing a magnetic field in a first direction that is orthogonal to a plane of the first, second, third, and fourth magnetoresistive sensors;
the first magnetoresistive sensor comprising:
a first sensing element having a first side lying parallel to the planar surface of the substrate, the first sensing element having a second side opposed to the first side and having first and second opposed edges; and
a first flux guide disposed orthogonal to and spaced from the first edge of the first sensing element;
the second magnetoresistive sensor comprising:
a second sensing element having a first side lying parallel to the planar surface of the substrate, the second sensing element having a second side opposed to the first side and having first and second opposed edges; and
a second flux guide disposed orthogonal to and spaced from the second edge of the second sensing element;
the third magnetoresistive sensor comprising:
a third sensing element having a first side lying parallel to the planar surface of the substrate, the third sensing element having a second side opposed to the first side and having first and second opposed edges; and
a third flux guide disposed orthogonal to and spaced from the second edge of the third sensing element; and
the fourth magnetoresistive sensor comprising:
a fourth sensing element having a first side lying parallel to the planar surface of the substrate, the fourth sensing element having a second side opposed to the first side and having first and second opposed edges; and
a fourth flux guide disposed orthogonal to and spaced from the first edge of the fourth sensing element,
wherein the first, second, third, and fourth, sensing elements define a first plane, and
wherein the first bridge circuit further comprises:
a first self-test current carrying line and a second self-test current carrying line disposed parallel to the second side of the first and third sensing elements and spaced away from the first and second edges of the first and third sensing elements, the first and second self-test current carrying lines being equidistant from, parallel to, and on opposed sides of a second plane perpendicular to the first plane and configured to create a magnetic field that is orthogonal to the plane of the first, second, third, and fourth magnetoresistive sensors of the first bridge circuit;
a third self-test current carrying line and a fourth self-test current carrying line disposed parallel to the second side of the second and fourth sensing elements and spaced away from the first and second edges of the second and fourth sensing elements, the third and fourth self-test current carrying lines being equidistant from, parallel to, and on opposed sides of a third plane perpendicular to the first plane, and configured to create a magnetic field that is orthogonal to the plane of the first, second, third, and fourth magnetoresistive sensors of the first bridge circuit.

6. The magnetic field sensor of claim 5, wherein a first component of a first magnetic field in a fourth plane parallel to the planar surface and created by a first current in a first direction in the first self-test current carrying line, and a second component of a second magnetic field in the fourth plane and created by a second current in a second direction in the second self-test current carrying line cancel one another at the intersection of the second plane and a first long axis of the first and third sensing elements, and the first and second magnetic field components parallel to the second plane are additive at the first and third flux guides, and a portion of components orthogonal to the plane of the first, second, third, and fourth magnetoresistive sensors of the first bridge circuit are guided into the first and third sensing elements as a third component.

7. The magnetic field sensor of claim 6, wherein the third component comprises a magnitude that is proportional to a size and a shape of the first flux guide and inversely proportional to a distance between the first flux guide and the first sensing element.

8. The magnetic field sensor of claim 5, wherein at least one of the first, second, and third flux guides includes a high permeability magnetic material.

9. The magnetic field sensor of claim 8, wherein the high permeability magnetic material of the at least one of the first, second, and third flux guides includes a soft ferromagnetic material.

10. The magnetic field sensor of claim 8, wherein the high permeability magnetic material includes nickel iron.

11. The magnetic field sensor of claim 5, wherein one or more of the first, second, third, and fourth flux guides is disposed below the first, second, third, and fourth sensing elements, respectively.

12. The magnetic field sensor of claim 5, further comprising:
a first stabilization line perpendicular to the first, second, third, and fourth self-test current carrying lines and adjacent the first and second sensing elements.

13. The magnetic field sensor of claim 12, further comprising:
a second stabilization line perpendicular to the first, second, third, and fourth self-test current carrying lines and adjacent the third and fourth sensing elements.

* * * * *